(12) United States Patent
Bourdat (10) Patent No.: US 10,994,311 B2
(45) Date of Patent: May 4, 2021

(54) SPECIFIC DEVICE FOR CLEANING ELECTRONIC COMPONENTS AND/OR CIRCUITS

(71) Applicant: Michel Bourdat, Saint Lys (FR)

(72) Inventor: Michel Bourdat, Saint Lys (FR)

( * ) Notice: Subject to any disclaimer, the term of this patent is extended or adjusted under 35 U.S.C. 154(b) by 135 days.

(21) Appl. No.: 16/156,946

(22) Filed: Oct. 10, 2018

(65) Prior Publication Data

US 2019/0039101 A1    Feb. 7, 2019

Related U.S. Application Data

(63) Continuation-in-part of application No. 14/894,951, filed as application No. PCT/FR2014/051270 on May 28, 2014, now Pat. No. 10,099,262.

(51) Int. Cl.
  *B08B 3/02* (2006.01)
  *H01L 21/67* (2006.01)
  *B08B 3/10* (2006.01)

(52) U.S. Cl.
  CPC .............. *B08B 3/024* (2013.01); *B08B 3/022* (2013.01); *B08B 3/102* (2013.01); *H01L 21/67051* (2013.01); *H01L 21/67057* (2013.01); *B08B 2220/01* (2013.01)

(58) Field of Classification Search
  CPC ......... H01L 21/67057; H01L 21/67051; B08B 3/024
  See application file for complete search history.

(56) References Cited

U.S. PATENT DOCUMENTS

| 4,863,643 | A | 9/1989 | Cochran |
| 5,522,941 | A | 6/1996 | Uchinami et al. |
| 6,454,867 | B1 | 9/2002 | Bourdat |
| 9,773,688 | B2 | 9/2017 | Haibara et al. |
| 2006/0137719 | A1 | 6/2006 | Hasegawa et al. |
| 2007/0221254 | A1* | 9/2007 | Izumi ................ H01L 21/67051 134/26 |
| 2007/0235062 | A1* | 10/2007 | Fujiwara ............. C03C 23/0075 134/4 |
| 2008/0173327 | A1 | 7/2008 | Miyagi |
| 2008/0230092 | A1 | 9/2008 | Ko et al. |
| 2010/0224214 | A1 | 9/2010 | Kaneko et al. |

(Continued)

FOREIGN PATENT DOCUMENTS

| EP | 2 060 318 A1 | 5/2009 |
| SU | 1688948 A1 | 11/1991 |
| WO | 95/28235 A1 | 10/1995 |

*Primary Examiner* — Spencer E Bell
(74) *Attorney, Agent, or Firm* — Seed Intellectual Property Law Group LLP (57) ABSTRACT

The disclosure relates to a device for cleaning electronic components and/or circuits. The cleaning device comprises a first vessel containing a liquid, a support for holding the electronic components and/or circuits, a fluid injection system including nozzles allowing the projection of jets of fluid to sweep the surface of the components, and a fluid mixer including a first inlet suitable for receiving a pressurised liquid, a second inlet suitable for receiving a pressurised gas, and an outlet designed to supply the injection system with two-phase fluid. The first inlet is coupled to the outlet by an inner duct, the second inlet is coupled to a pressurised gas supply and to an injector for injecting the gas into the inner duct.

19 Claims, 7 Drawing Sheets

(56) References Cited

U.S. PATENT DOCUMENTS

2012/0240958 A1* 9/2012 Higuchi ............ H01L 21/67057
  134/10
2012/0276474 A1* 11/2012 Yamauchi ......... H01L 21/02052
  430/5
2016/0329219 A1* 11/2016 Lee ................... H01L 21/67057

* cited by examiner

SPECIFIC DEVICE FOR CLEANING ELECTRONIC COMPONENTS AND/OR CIRCUITS

BACKGROUND

Technical Field

The present invention relates to a specific device for cleaning electronic components and/or circuits such as, for example, circuit boards or silicon-based substrates.

Description of the Related Art

The invention can find applications, for example but not exclusively, in the field of microelectronics manufacturing. The invention can also find applications in the field of electronics manufacturing. For example, during a phase of soldering surface mounted components ("SMC") in a solder oven, solder or cream residues remain adhering to the surface of the board or to the components, which can cause the circuit board to malfunction. It is therefore necessary to clean the board after soldering operations.

The cleaning of electronic components and/or circuits having previously undergone steps such as of soldering or gluing, requires efficient cleaning devices and processes.

Solder residue on a circuit board is particularly difficult to remove, due to the complex topography of a circuit board as well as its fragility.

U.S. Pat. No. 6,454,867 entitled "Method and Machine for Cleaning Objects in Plate Form" presents a machine and its method for cleaning circuit boards of their residues using an immersion technique. Said machine comprises a wash vessel in which the object to be washed is completely immersed in a vertical orientation parallel to the walls of the wash vessel. The vessel is filled with a cleansing liquid that is an azeotropic liquid. In order to reduce costs as well as the environmental impact of such a device, a cleaning liquid recovery system and filter system provide a closed loop circulation and filtration of the liquid.

To improve the effectiveness of the wash, the method proposed by U.S. Pat. No. 6,454,867 makes use of a generator of ultrasonic waves in the wash vessel to facilitate detachment of the particles to be removed. This technique greatly improves the quality of the cleaning but cannot be used for cleaning circuit boards intended for avionics. Indeed, the presence of numerous technologically advanced electronic components and especially components such as quartz means the use of ultrasound is prohibited by regulations.

In addition, such techniques have difficulties with removing certain residues such as glue on screen printing masks or in areas that are difficult to reach, such as beneath an integrated circuit for example.

BRIEF SUMMARY

The invention aims to overcome these disadvantages. More particularly, the invention aims to allow cleaning electronic components and/or circuits contaminated by residues of different densities, sizes, and natures, particularly glue or solder cream. In particular, the invention aims to allow the removal of residues located in hard-to-reach areas such as beneath an integrated circuit of a circuit board. Advantageously, the invention can be implemented in the field of avionics. It will also preferably allow the elimination of residues in via holes in printed circuits. The invention thus aims to increase performance in the cleaning and removal of residues on circuit boards for applications in avionics for example or on semiconductor components deposited on flexible Kapton-based substrates.

To this end, the invention proposes a specific device for cleaning electronic components and/or circuits, comprising:
a first vessel containing a liquid,
support means for keeping the electronic components and/or circuit immersed in the first vessel,
a fluid injection system comprising nozzles for spraying jets of fluid onto the electronic components and/or circuit to be cleaned,
means enabling the jets of fluid from the nozzles to sweep the surface of the electronic components and/or circuit to be cleaned.

According to the invention, the cleaning device further comprises a fluid mixer comprising a first inlet suitable for receiving a pressurized liquid, a second inlet suitable for receiving a pressurized gas, an outlet designed for supplying the injection system with two-phase fluid, the first inlet being coupled to the outlet by an inner duct, the second inlet being supplied with pressurized gas and connected to an injector for injecting said gas into the inner duct.

The mixer proposed here for the cleaning device allows creating a two-phase fluid in which the gas is intimately mixed with the liquid and forms microbubbles within it. Using a jet of such a two-phase fluid to clean electronic components and/or circuits contaminated by solder residue dramatically improves the cleaning efficiency, due to the properties of the two-phase fluid. When the two-phase fluid comes into contact with the surface of the electronic components and/or circuits to be cleaned, a microbubble release phenomenon occurs at the surface of the electronic components and/or circuits, similar to ultrasonic cavitation. This technique can even remove glue residues while avoiding the use of ultrasound and thus can be used in the field of avionics.

In an advantageous embodiment, the injection system is such that the pressure at the nozzles is less than or equal to 5 bar, which provides effective cleaning without damaging electronic components and/or circuits that are highly fragile in nature.

In order to obtain a homogeneous two-phase fluid, the mixer injector injects the pressurized gas at the center of the inner duct of the fluid mixer. The concentric position of the injector relative to the inner duct prevents the formation of gas bubble clusters in the two-phase fluid.

The difference between the pressure of the fluid and the pressure of the gas inside the fluid mixer is about 1 bar. It has been noted that this pressure difference, with the gas at a higher pressure than the liquid, allows creating a highly homogeneous two-phase fluid that is therefore very effective for cleaning. The pressure difference between the injected gas and the liquid receiving this gas will be for example between 0.5 and 2 bar.

Advantageously, the cleaning device comprises an overflow vessel for recovering liquid from the first vessel. Said liquid which thus flows into the overflow vessel is without the heavy residues which remain in the first vessel.

Liquid is advantageously suctioned from inside the overflow vessel by a hydraulic device that connects the overflow vessel to the fluid mixer. The mixer is then supplied by one of these inlets with liquid from which the largest washing residues have already been eliminated.

To further protect the fluid mixer from cleaning residues coming from the overflow vessel, the mixer is advantageously placed downstream of a filter.

According to one embodiment of the invention, the fluid mixer has a Y shape in order to facilitate mixing the gas and liquid inside it. This shape allows the creation of gas microbubbles in the liquid coming from the overflow vessel. In addition, the fluid mixer is advantageously placed upstream of the first vessel in order to facilitate integrating the mixer into the cleaning device.

One embodiment of the invention provides that the means enabling the nozzles to sweep the surface of the electronic components and/or circuit to be cleaned comprises means for moving the support means vertically. It may also be arranged, possibly as an addition to this embodiment in order to achieve an effective cleaning, that this means allowing the nozzles to sweep the surface of the electronic components and/or circuits to be cleaned comprises means for moving the nozzles horizontally. A preferred embodiment provides for combining movements of the support for the electronic components and/or circuits and movements of the nozzles, to greatly increase the cleaning effectiveness. It is then possible to remove the residues on circuit boards and/or components more easily.

To reduce the cleaning time but also to protect the electronic components and/or circuits to be cleaned from any mechanical stresses created by the projection of a fluid, a preferred embodiment of the invention further provides that the system for injecting a two-phase fluid onto the electronic components and/or circuits to be cleaned comprises two nozzle arrays that are interconnected and arranged on both sides of the electronic components and/or circuits, thus enabling the simultaneous cleaning of both faces of the electronic components and/or circuits.

Advantageously, depending on the thickness of the electronic components and/or circuits to be cleaned, the distance between the nozzle arrays and said electronic components and/or circuits to be cleaned is adjustable.

In a preferred embodiment, the fluid mixer comprises a conical tapering to homogenize the distribution of gas bubbles in the fluid. The two-phase fluid thus does not contain groups or clusters of gas bubbles.

Advantageously, the pressurized gas injected in the second inlet of the fluid mixer is a neutral gas. It is then possible to clean electronic components and/or circuits having easily oxidized materials such as copper.

In one exemplary embodiment, the inner duct of the fluid mixer has a diameter of between 15 and 25 mm.

The injector of the mixer has, for example, an inner diameter of less than 4 mm. With a relatively small diameter of the injector, it is easier to achieve a homogeneous two-phase fluid and to control the parameters characteristic of the two-phase fluid.

In order to warranty the same outlet pressure and outlet flow in the nozzles for spraying the two-phase fluid onto the electronic components, the ratio between the open surface of the liquid pipe in the fluid mixer and the total surface of the spraying nozzles, is advantageously chosen between 3 and 8 for example around 5 or 6. For example, if the inner duct for liquid in the fluid mixer has a diameter of 16 mm, it has a surface around 200 mm². The spraying system then presents a number of 30 to 40 nozzles having each an outlet surface of 1 mm² of aperture each so that the outlet surface is between 30 and 40 mm².

BRIEF DESCRIPTION OF THE SEVERAL VIEWS OF THE DRAWINGS

Other features and advantages of the invention will become apparent upon reading the following description. This description is purely illustrative and is to be read with reference to the accompanying drawing, in which.

DETAILED DESCRIPTION

Figure 1:
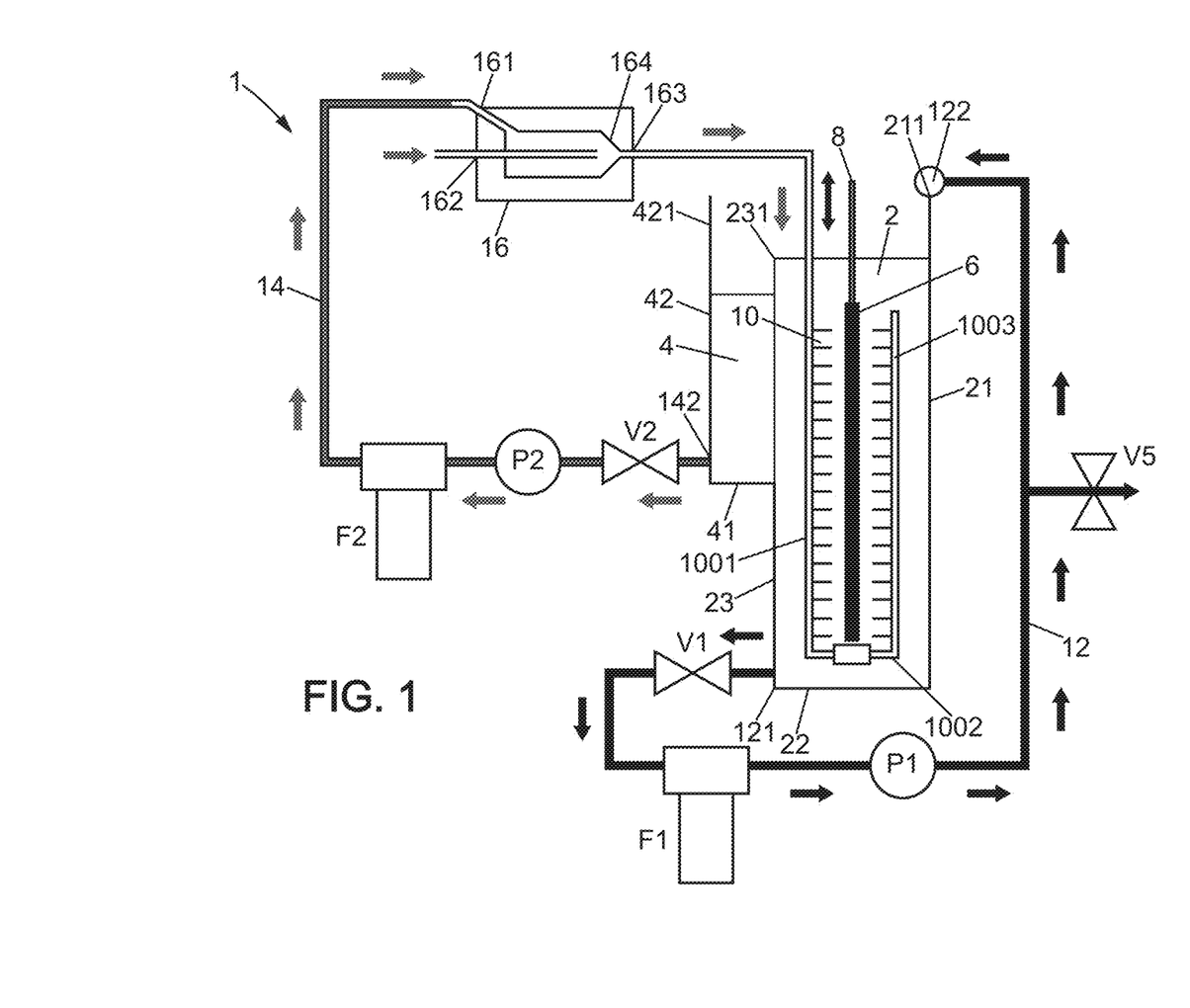
FIG. 1 is a block diagram of the device of the invention.

FIG. 1 shows a device 1 comprising a first vessel 2, and a second vessel referred to as the overflow vessel 4, both of generally rectangular shapes and suitable for containing a liquid.

Support means 8 arranged inside the first vessel 2 keep the electronic components and/or circuits 6 to be cleaned immersed in the liquid contained therein. Said electronic components and/or circuits 6 to be cleaned are, for example, silicon substrates which may be flexible or assemblies of semiconductor-based chips. They may be also be circuit boards or screen printing stencils.

The first vessel 2, also called the cleaning vessel, consists of metal walls of stainless steel. It comprises, inter alia, a first outer vertical wall 21, a lower horizontal bottom 22, and an inner vertical wall 23, referred to as the overflow wall with an uppermost edge 231 at a height less than that of an uppermost edge 211 of the outer vertical wall 21. The inner vertical wall 23 is designed so that the liquid contained in the first vessel 2 overflows over the uppermost edge 231 into the overflow vessel 4 adjacent to the first vessel 2.

The overflow vessel 4 is also made of metal walls of stainless steel. It comprises, inter alia, a first outer vertical wall 42, a horizontal bottom 41, and a second vertical wall corresponding to the upper portion of the inner vertical wall 23 of the first vessel 2. In addition, both vessels are open at the top and the lower horizontal bottom 22 of the first vessel 2 is at a lower height than the horizontal bottom 41 of the overflow vessel 4.

The electronic components and/or circuits 6 to be cleaned, as shown in FIG. 1, are placed parallel to the outer vertical wall 21 of the first vessel 2 such that they cannot come into contact with the lower horizontal bottom 22 of the first vessel 2, to avoid interfering with the flow of liquid in said first vessel 2. The electronic components and/or circuits 6 to be cleaned are held in place by the support means 8. These means may be a system based on hooks or arms enabling total immersion of the electronic components and/or circuits 6 to be cleaned in the first vessel 2. In addition, the support means 8 may be able to move vertically (represented by a double arrow in FIG. 1) under the control of a suitable control device not represented in FIG. 1.

The device 1 also comprises two hydraulic devices enabling the circulation of the liquid contained in the two vessels.

A first hydraulic device 12 is associated with the first vessel 2. It enables circulation of the liquid in the first vessel 2 via a suction mouth 121 placed at the bottom of the first vessel 2 and a return at one end 122 of the first hydraulic device 12, preferably placed at the top of the outer vertical wall 21 of the first vessel 2, thus allowing the reinjection of the liquid into the first vessel 2.

The first hydraulic device 12 allows the recovery, filtration, and injection of the liquid contained in the first vessel 2. It comprises for this purpose a valve V1, a pump P1, and a filter F1.

The valve V1 can be electrically or manually controlled and allows, inter alia, isolating the first vessel 2 during potential incidents.

The filter F1 is arranged within the first hydraulic device 12 and is placed for example downstream of the valve V1, to provide filtration and even the elimination of cleaning residues from the liquid coming from the first vessel 2.

The pump P1 may be a vane pump or magnetic drive pump for example and is used for circulating the liquid in the first hydraulic device 12.

Here, a manually or electrically controlled valve V5 is positioned downstream of the pump P1 to allow draining the liquid contained in the first vessel 2 into a recovery vessel (not shown in FIG. 1), for example by means of the pump P1. This valve V5 is mounted on a bypass of the first hydraulic device 12.

A second hydraulic device 14 comprises a valve V2, a pump P2, a filter F2, and a mixer 16. The second hydraulic device 14 allows, inter alia, suctioning the liquid in the overflow vessel 4 and injecting it into the first vessel 2. To do this, a suction mouth 142 is positioned so that the liquid is preferably suctioned at the bottom of the wall 42 of the overflow vessel 4. The liquid is returned through a fluid injection system placed in the first vessel 2.

Valve V2, located in the second hydraulic device 14, can be manually operated or electrically controlled for example by solenoid. This valve V2 allows isolating the overflow vessel 4 for safety reasons when there is a potential incident.

The liquid in the overflow vessel 4 is suctioned by pump P2, here placed downstream of valve V2. The filter F2 placed downstream of pump P2 allows filtration, in other words the removal of cleaning residues from the liquid coming from the overflow vessel 4, these residues originating from the electronic components and/or circuits 6 to be cleaned, among other sources.

Figure 2:
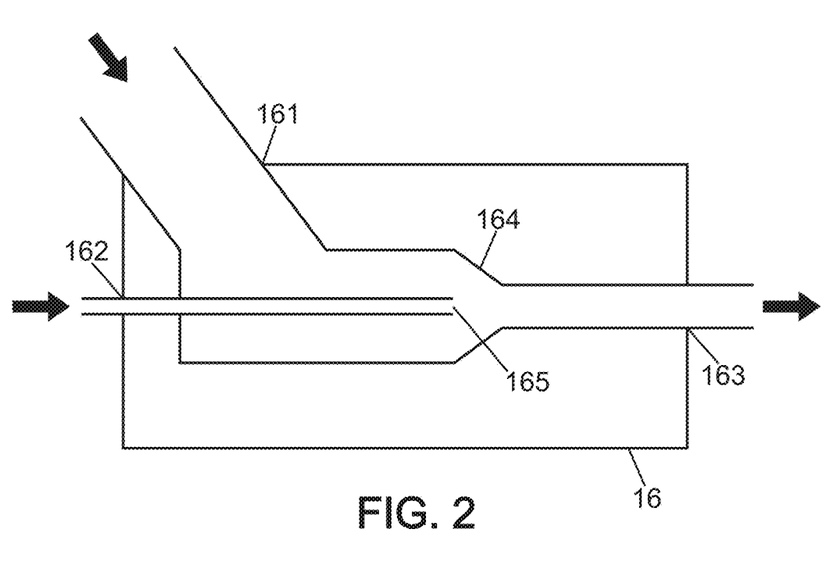
FIG. 2 is a schematic view of an enlarged portion of the device of FIG. 1.

The mixer 16 is placed downstream of the filter F2 in the second hydraulic device 14 and is placed upstream of the first vessel 2. It comprises a first inlet 161 adapted to receive a pressurized liquid coming from filter F2 propelled by pump P2 in the second hydraulic device 14, a second inlet 162 adapted to receive a pressurized gas, and an outlet 163. FIG. 2 is a schematic enlarged view of the mixer 16.

All numerical values given here are provided for purely illustrative and non-limiting purposes.

The first inlet 161 is coupled to the outlet 163 by means of an inner duct of the mixer 16. The diameter of the inner duct is for example about 16 mm (1 mm=0.001 m) until the conical tapering 164 where the duct diameter changes from 16 mm (on the first inlet side 161) to a duct diameter of 13 mm (on the outlet side 163) (FIG. 2).

The second inlet 162 is coupled outside the mixer 16 to a source of pressurized gas. Inside the mixer 16, the second inlet 162 is connected to an injector 165 for injecting said gas inside the inner duct. The inner diameter of the injector 165 is, for example, about 4 mm with an outer diameter of about 8 mm. The mixer 16 thus has a Y-shape.

In an advantageous embodiment, the injector 165 is positioned at the center of the inner duct of the mixer 16, in other words concentric to the inner duct. In addition, the injector 165 penetrates sufficiently far into the inner duct and its end in the inner duct is close to the conical tapering 164 of the inner duct so that the injection of the pressurized gas at the center of the inner duct enables the creation of a two-phase fluid. This conical tapering 164 accelerates the two-phase fluid, which homogenizes the distribution of the gas bubbles.

The gas injected into the second input 162 may be an inert gas, such as nitrogen, making it possible to clean exposed or highly oxidizable copper parts such as power modules used for power management in electric vehicles. It is also possible for the injected gas to be a protective gas or reducing agent.

The pressure of the liquid injected into the first inlet 161 is about 3 to 5 bar (1 bar=$10^5$ Pascal) with a flow rate of 20 liters/min. The pressure of the gas injected into the second inlet 162 is 0.5 to 2 bar greater, preferably about 1 bar, than the pressure of the liquid and its flow rate is about 10 liters/min. Advantageously, the flow rates and pressures of the inlets of the mixer 16 are adjustable.

The flow rate and pressure within the second hydraulic device 14 as well as at the second inlet 162 of the mixer 16 are sufficient to meet the requirements for cleaning the electronic components and/or circuits 6 to be cleaned.

The fluid injection system comprises two arrays of nozzles 1001 and 1003 immersed in the first vessel 2. The two arrays of nozzles 1001 and 1003 have nozzles 10 placed so that the jets from these nozzles 10 are laminar jets of liquid that are cylindrical in shape and that strike perpendicularly to the surface of the electronic components and/or circuits 6 to be cleaned (see FIG. 1).

Said arrays of nozzles 1001 and 1003 consist of at least one row having at least one nozzle 10 and at least one column having at least one nozzle 10. The number of nozzles 10, in other words the number of rows and columns, in the nozzle arrays 1001 and 1003 can be modified according to the size of the electronic components and/or circuits 6 to be cleaned.

However, the total outlet surface of the nozzles may be adapted to the system. In one embodiment, the number of nozzles can be between 25 and 50, for example between 30 and 40. The aperture of each nozzle is preferably small. It may be smaller than 2 mm$^2$, for example around 1 mm$^2$±10%. If the diameter of the inner duct of the mixer is 16 mm, its cross-sectional area is about 200 mm$^2$. In this case, the ratio between the cross-sectional areas of the duct for liquid and the apertures for injecting gas into the liquid is advantageously between 4 and 6. This ratio is also valid for other diameters of the inner duct for liquid.

In addition, in order to protect the electronic components and/or circuits 6 to be cleaned from all mechanical stresses created by spraying liquid onto its two opposing faces, the nozzle arrays 1001 and 1003 are positioned parallel to the electronic components and/or circuits 6 to be cleaned, one on either side thereof (see FIG. 1). To protect fragile electronic components and/or circuits 6 such as semiconductors on flexible Kapton, the distance separating the electronic components and/or circuits 6 to be cleaned from the nozzle is about 2 to 5 cm. The nozzle array 1003 is supplied with two-phase fluid from the hydraulic device 14 by means of a hydraulic supply device 1002 connecting the first nozzle array 1001 to the second nozzle array 1003. The pressure of the jet of two-phase fluid at the nozzles 10 is preferably less than 5 bar. Although relatively small, this pressure allows effectively cleaning the components or boards to be cleaned, while ensuring that the cleaned objects are not damaged.

The hydraulic supply device 1002 is preferably located at the bottom of the first vessel 2 but not touching its lower horizontal bottom 22 so that it does not interfere with the circulation of liquid in the first vessel 2.

In addition, the first nozzle array 1001 and the second nozzle array 1003 can, by means of a sweep motion device not shown in FIG. 1, perform a movement perpendicular to the plane of FIG. 1. This movement allows sweeping the jets of fluid across the electronic components and/or circuits 6 to be cleaned by the two nozzle arrays.

This sweep motion device may also be coupled to the movement of the support means 8. The combined movements then facilitate the removal of residues deposited underneath integrated circuits. The removal of residues deposited in via holes is also enhanced using this technique.

In addition, the distance between each nozzle array and the electronic components and/or circuits 6 to be cleaned is determined so as to maximize the effectiveness of the two-phase fluid jets: this can be for example about 5 to 10 cm.

Figure 3:
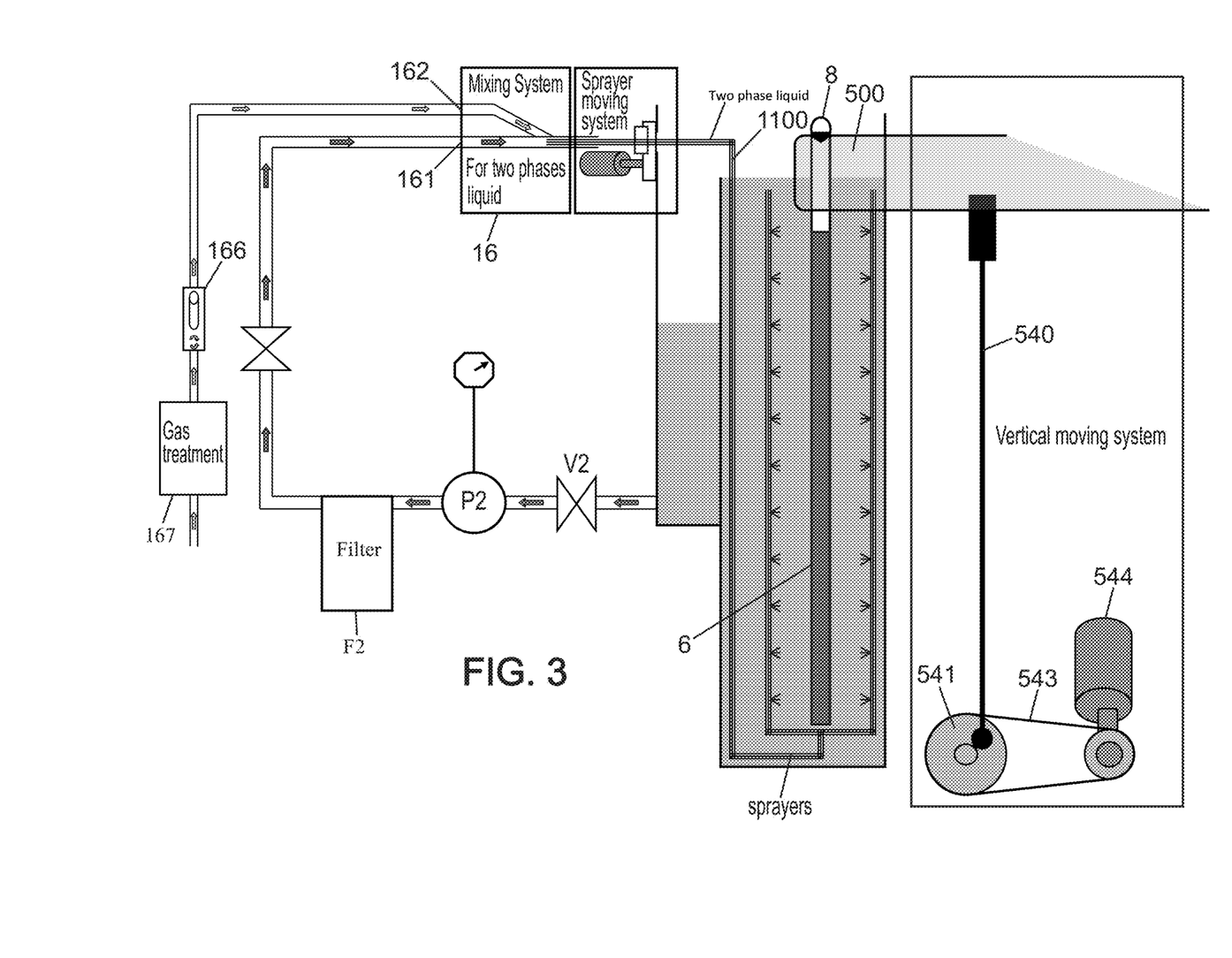
FIG. 3 is a view corresponding to FIG. 1 for an alternative embodiment.

FIG. 3 shows an alternative embodiment of the device of FIG. 1 and gives more details concerning the moving between the nozzles 1001 and 1003 and the electronic components and/or circuits 6. The device shown on FIG. 3 has the same structure than the device of FIG. 1. FIG. 3 does not show the first hydraulic device 12 shown on FIG. 1 in order to simplify the figure. The mixer 16 is also shown in a simplified manner on FIG. 3 but it has preferably the same structure than shown on FIGS. 1 and 2. FIG. 3 shows supply means of gas for the mixer 16. These means include a flowmeter 166 and a gas filtration device 167.

Figure 4:
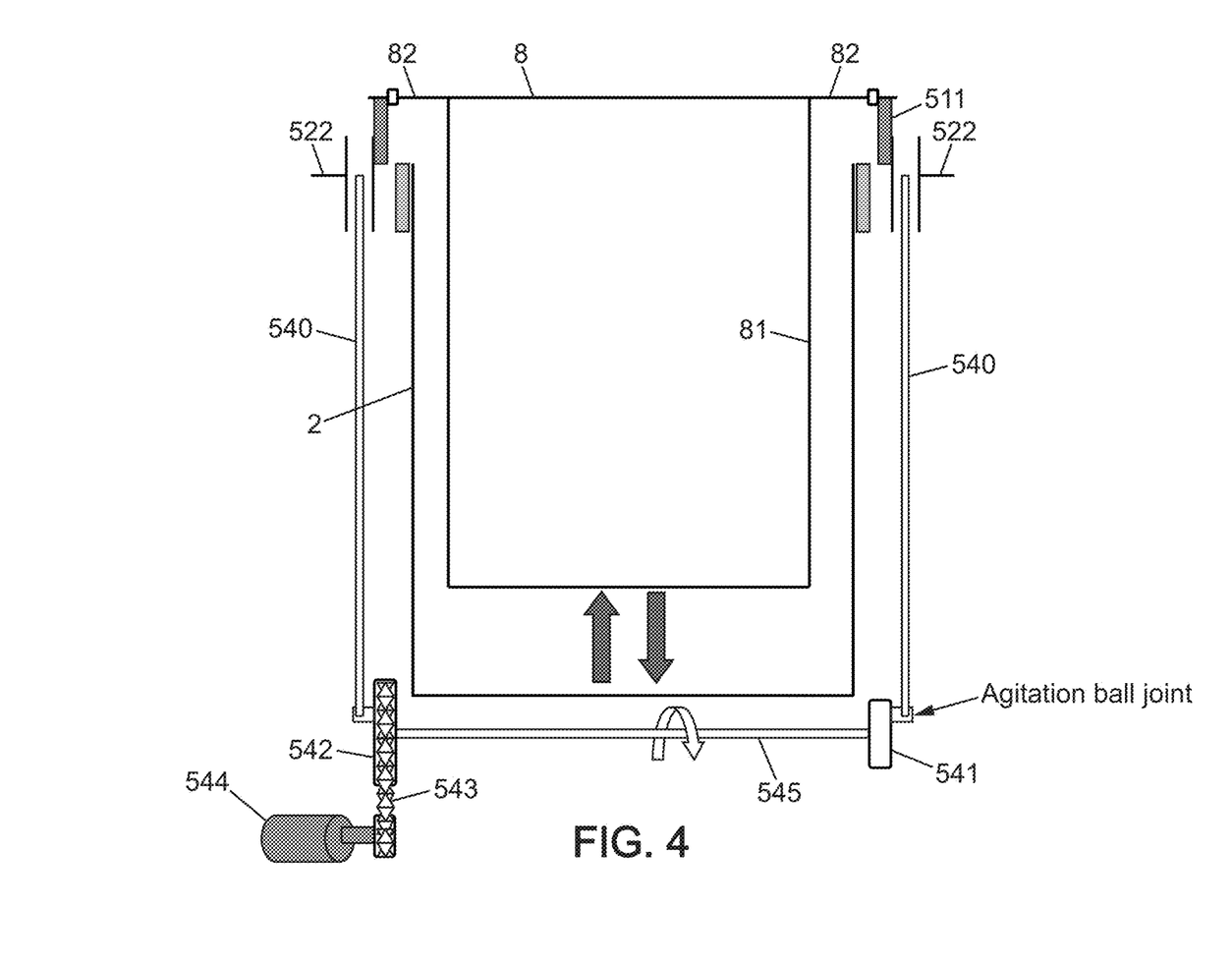
FIG. 4 is a schematic front view of a vertical moving system.
Figure 6:
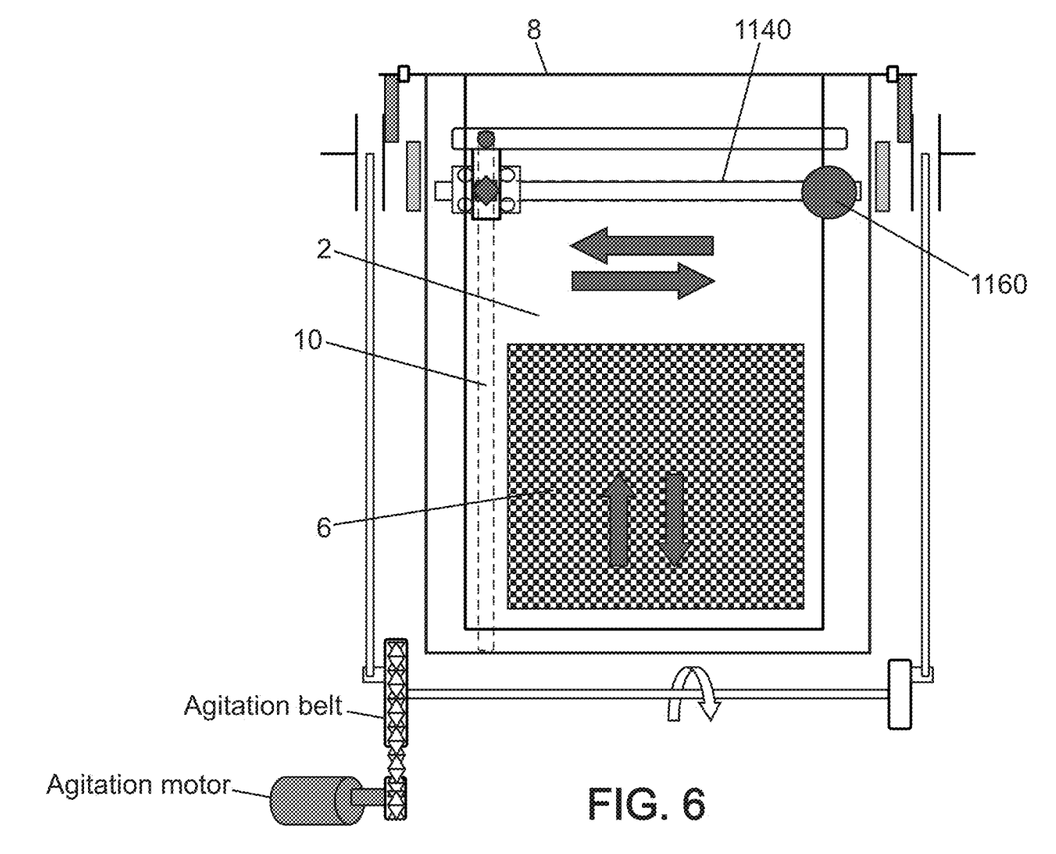
FIG. 6 is a schematic front view showing together the vertical moving system of FIG. 4 and the horizontal moving system of FIG. 5.
Figure 7:
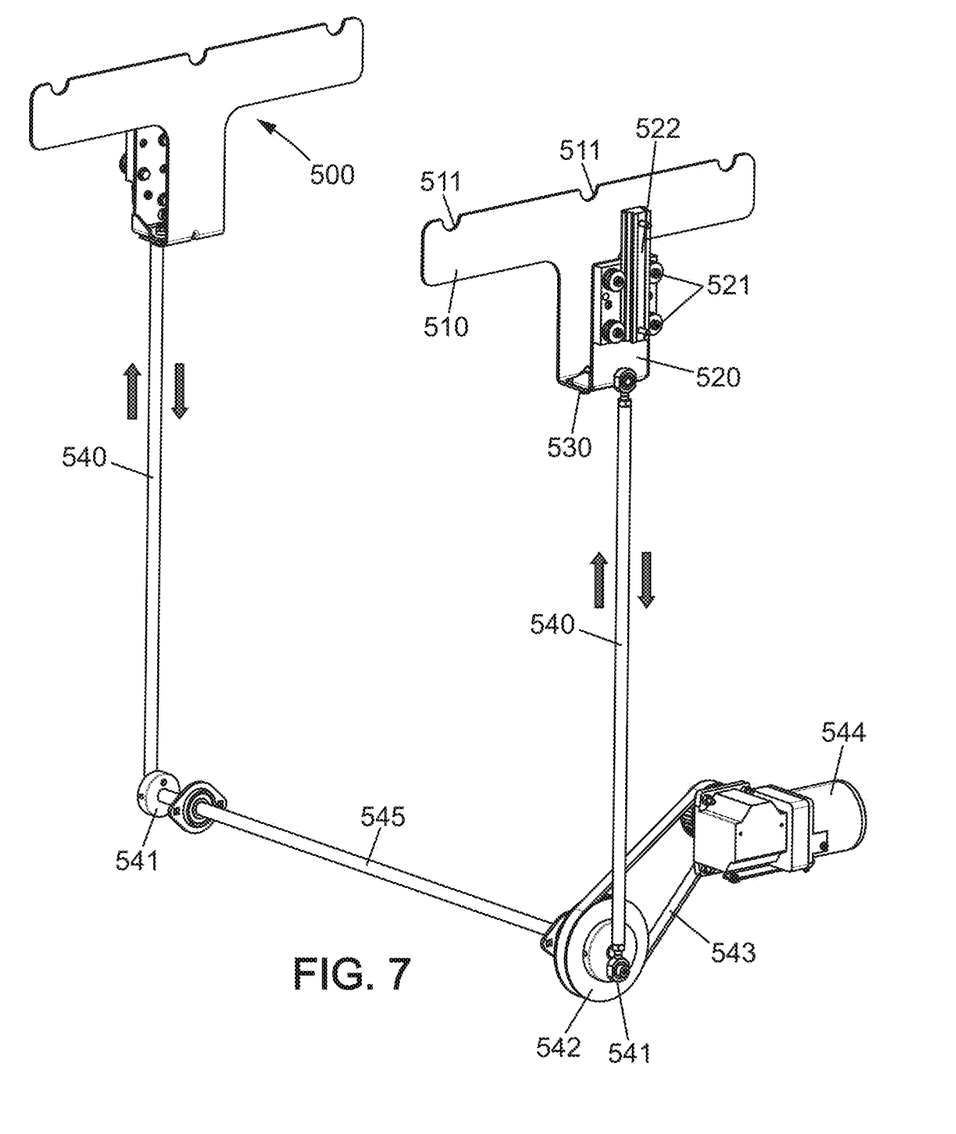
FIG. 7 is a perspective view of the vertical moving system.

A vertical moving system is shown on FIGS. 3, 4 and 6. The parts of this vertical moving system are referenced with numbers in the five-hundreds. This vertical moving system moves the support means 8 of the electronic components and/or circuits 6. The support means 8 include a frame 81 with two holding arms 82. The arms 82 rest on a U-shaped agitation support 500.

The U-shaped agitation support 500 has a first vertical wall 510, a second vertical wall 520 and a base 530 which links the first vertical wall 510 to the second vertical wall 520. The first vertical wall 510 has notches 511 for receiving the holdings arms 82. The second vertical wall 520 carries two pairs of rollers 521 which are guiding a vertical rail 522. The vertical rail 522 is fixed, for example in regard to the vessel 2, and does not move.

Each U-shaped agitation support 500 is driven by a rod 540. A first end of the rod 540 is attached to the U-shaped agitation support 500 and the other end of this rod 540 is attached in an eccentric manner to a wheel 541. A first wheel 541 is fixed on a pulley 542 which is driven through a belt 543 by a motor 544. The second wheel 541 is mounted at the end of a shaft 545 having the same rotation axis than the pulley 542 and driven by the pulley 542. In this way, the movements of the U-shaped agitation support 500 are synchronous.

Figure 5:
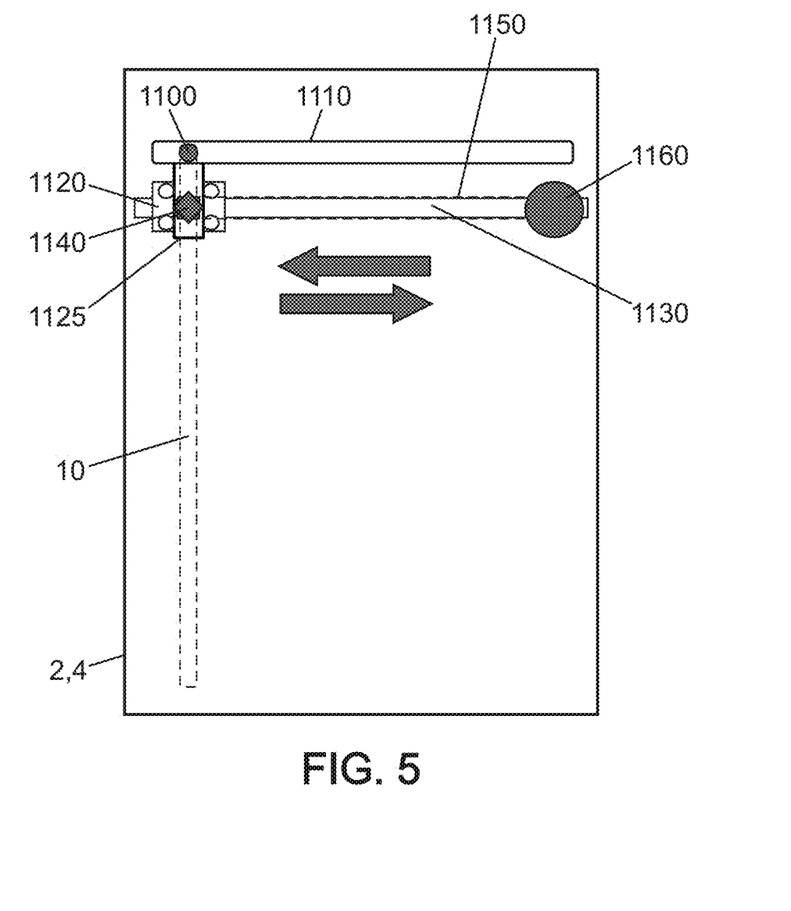
FIG. 5 is a schematic front view of a horizontal moving system.

FIGS. 3, 5 and 6 show the horizontal moving system for the nozzles. The parts of this horizontal moving system are referenced with numbers in the eleven-hundreds.

In the shown example, the nozzles 10 are arranged on a tubular stirrup having two vertical legs linked by a horizontal base. Each vertical leg corresponds to a nozzle array (1001 or 1003). In the embodiment corresponding to FIGS. 3-7, the nozzle array is formed by only one column of nozzles 10. The tubular stirrup is supplied with the two-phase fluid at its base, preferably in the middle of the base so that the pressure of the two-phase fluid is symmetric in both vertical legs. The stirrup is supplied with two-phase fluid by a supply line 1100 coming from the mixer 16. This supply line 1100 goes through an horizontal slot 1110 of the vertical wall 42 of the overflow vessel 4. This is a preferred arrangement. The horizontal slot could also be arranged in another vertical wall of the main vessel 2 or of the overflow vessel 4.

The supply line 1100 is connected to a trolley 1120 by a link 1125. The trolley 1120 is guided on an horizontal rail 1130. The rail 1130 is preferably fixed on the wall carrying the horizontal slot 1110. The trolley 1120 is coupled to a driving chain 1150 moving between a driving motor 1160 and a sprayer cog 1140.

This system can move the nozzles 10 horizontally. The motor 1160 drives the driving chain 1150 and so the trolley 1120 moves along the horizontal rail 1130. Through the link 1125, the stirrup with the nozzles 10 moves horizontally in the vessel 2.

Through the vertical movement of the support means 8 and the horizontal movement of the nozzles 10, the two-phase fluid can clean the entire surface, on both sides, of the electronic components and/or circuits 6. The stirrup distributes the pressure of the two-phase fluid equally on both sides of the electronic components and/or circuits 6 so that the global forces exerted on the parts to be cleaned balance. The action of the two-phase fluid combined with the moving of the parts to be cleaned and the nozzles allows a very high quality level of cleaning without using ultrasounds.

In another embodiment, a pressure regulating device (not represented in the figures), making use of pressure sensors for example, is used to control the pressure of the liquid and the gas. In order to improve the performance and reproducibility of the cleaning, a fluid temperature control device may also be used, for example making use of a temperature sensor. The gas may be for example at room temperature. However, it is also possible to consider a gas temperature control. It is thus possible to completely control the characteristics of the two-phase fluid.

Effective cleaning of circuit boards, especially circuit boards for avionic applications, is now possible by means of a device as described above. The use of a two-phase fluid instead of an ultrasonic generator allows the device to be effective for cleaning without damaging or harming electronic components, even those containing quartz.

In addition, as the effectiveness of the two-phase jet is independent of the nature of the materials, for example such as glue or solder paste, the cleaning of screen printing masks is optimized with such a device. It has been observed that the presence of microbubbles in the fluid injected from the nozzles onto the electronic components and/or circuits results in highly effective cleaning even for products such as glue which are considered as not being removable by cleaning.

One will appreciate that the invention is not limited by the nature and form of the vessel or vessels. Also, the embodiment of the device shown in FIG. 1 is only one non-limiting example. The component materials of the vessels can be of a different nature from what is stated in the description. Any technically feasible variant that is within the reach of the skilled person may be preferred to the described embodiments. Thus, the number of filters on the hydraulic lines or the type of pumps is not limited to the examples given here purely for illustrative purposes.

The above description has been provided for illustrative purposes only and does not limit the scope of the invention.

The invention claimed is:

1. A device for cleaning electronic components or circuits, comprising:
   a first vessel containing a liquid;

support means for keeping the electronic components or circuits immersed in the first vessel;

a fluid injection system comprising nozzles for spraying jets of a two-phase fluid onto the electronic components or circuits to be cleaned, wherein the nozzles are arranged on a tubular stirrup having two vertical legs linked by a horizontal base, and the tubular stirrup, in use, is supplied with a two-phase fluid at the horizontal base;

sweep means enabling the jets of fluid from the nozzles to sweep the surface of the electronic components or circuits to be cleaned, wherein the sweep means comprise means for moving the support means vertically; and a fluid mixer comprising a first inlet suitable for receiving a pressurized liquid, a second inlet suitable for receiving a pressurized gas, an outlet designed for supplying the injection system with the two-phase fluid, the first inlet being coupled to the outlet by an inner duct, the second inlet being supplied with the pressurized gas and connected to an injector for injecting said pressurized gas into the inner duct.

2. The device according to claim 1, wherein the injection system is such the nozzles have a pressure that is less than or equal to 5 bar.

3. The device according to claim 1, wherein the injector injects the pressurized gas at a center of the inner duct of the fluid mixer.

4. The device according to claim 1, wherein a difference between a pressure of the fluid and a pressure of the gas inside the fluid mixer is about 1 bar.

5. The device according to claim 1, further comprising an overflow vessel.

6. The device according to claim 5, further comprising a hydraulic device that connects the overflow vessel to the fluid mixer.

7. The device according to claim 1, further comprising a filter, wherein the fluid mixer is placed downstream of the filter.

8. The device according to claim 1, wherein the fluid mixer has a Y-shape.

9. The device according to claim 1, wherein the fluid mixer is placed upstream of the first vessel.

10. The device according to claim 1, wherein the fluid injection system comprises means for moving the nozzles horizontally.

11. The device of claim 10, wherein the tubular stirrup is supplied with the two-phase fluid by a supply line coupled between the fluid mixer and the tubular stirrup.

12. The device of claim 11, wherein the means for moving the nozzles horizontally includes:
a trolley;
a link connected to the supply line and the trolley; and
a horizontal rail configured to guide a horizontal movement of the trolley.

13. The device according to claim 1, wherein the fluid injection system comprises two nozzle arrays that are interconnected and arranged on both sides of the electronic components or circuits to be cleaned.

14. The device according to claim 1, wherein a distance between the nozzles and the electronic components or circuits is adjustable.

15. The device according to claim 1, wherein the inner duct of the fluid mixer comprises a conical tapering.

16. The device according to claim 1, wherein the pressurized gas injected in the second inlet of the fluid mixer is a neutral gas.

17. The device according to claim 1, wherein the inner duct of the fluid mixer has a diameter of between 15 and 25 mm.

18. The device according to claim 1, wherein the injector of the mixer has an inner diameter of less than 4 mm.

19. The device of claim 1, wherein the tubular stirrup, in use, is supplied with the two-phase fluid at the middle of the horizontal base.

* * * * *

UNITED STATES PATENT AND TRADEMARK OFFICE
CERTIFICATE OF CORRECTION

| | | |
|---|---|---|
| PATENT NO. | : 10,994,311 B2 | Page 1 of 1 |
| APPLICATION NO. | : 16/156946 | |
| DATED | : May 4, 2021 | |
| INVENTOR(S) | : Michel Bourdat | |

It is certified that error appears in the above-identified patent and that said Letters Patent is hereby corrected as shown below:

On the Title Page

Insert Item (30):
--(30)   Foreign Application Priority Data
May 31, 2013   (FR)………13 550011--

Signed and Sealed this
Second Day of August, 2022

Katherine Kelly Vidal
*Director of the United States Patent and Trademark Office*